United States Patent [19]
Lin

[11] Patent Number: 5,017,985
[45] Date of Patent: May 21, 1991

[54] INPUT PROTECTION ARRANGEMENT FOR VLSI INTEGRATED CIRCUIT DEVICES

[75] Inventor: Chong M. Lin, Shrewsbury, Mass.

[73] Assignee: Digital Equipment Corporation, Maynard, Mass.

[21] Appl. No.: 438,706

[22] Filed: Nov. 17, 1989

Related U.S. Application Data

[63] Continuation of Ser. No. 606,667, May 3, 1984, abandoned.

[51] Int. Cl.$^5$ .............................................. H01L 29/78
[52] U.S. Cl. .................................. 357/23.13; 357/90; 361/56; 361/91
[58] Field of Search ...................... 357/23.13, 23.8, 59, 357/90, 51; 361/56, 91

[56] References Cited

U.S. PATENT DOCUMENTS

| | | | |
|---|---|---|---|
| 3,395,290 | 7/1963 | Farina | 307/202 |
| 3,400,310 | 9/1968 | Dorendorf | 317/234 |
| 4,400,711 | 8/1983 | Avery | 357/43 |
| 4,730,208 | 3/1988 | Sugino et al. | 357/23.8 |

FOREIGN PATENT DOCUMENTS

| | | |
|---|---|---|
| 0106417 | 4/1984 | European Pat. Off. . |
| 54-136278 | 10/1979 | Japan . |
| 54-137286 | 10/1979 | Japan . |
| 55-86159 | 6/1980 | Japan . |
| 56-67962 | 6/1981 | Japan . |
| 2113468 | 8/1983 | United Kingdom . |

*Primary Examiner*—Mark Prenty
*Attorney, Agent, or Firm*—Cesari & McKenna

[57] ABSTRACT

An input protection arrangement for diverting current from high voltages due to, for example electrostatic discharges into a bonding pad of an integrated circuit chip. The chip has a bonding pad connected to a conducting path and to a source or drain region of an insulated gate field effect transistor, the other region being connected to a power bus on the chip. The conducting path runs between the source and drain regions and operates as the gate terminal of the transistor. The conducting path is insulated from the surface of the chip by a field oxide insulating layer of a substantially uniform thickness to prevent rupture of the oxide between the gate and the source and drain regions in the event of high-voltages. The source and drain regions include regions of conventional doping levels having depths corresponding to the depths of the other corresponding regions on the chip, surrounded by large wells of lower doping levels. The input pad is separated from the chip substrate by an insulating oxide layer and by a doped well of the same conductivity type as the source and drain regions of the transistor to reduce the input capacitance and prevent punch through from the pad to the substrate.

6 Claims, 3 Drawing Sheets

INPUT PROTECTION ARRANGEMENT FOR VLSI INTEGRATED CIRCUIT DEVICES

This application is a continuation of U.S. Pat. No. 06/606,667, filed May 3, 1984, now abandoned.

BACKGROUND OF THE INVENTION

1. Field of the Invention

The invention relates generally to the field of integrated circuit devices, and more specifically to protection arrangements for protecting the input circuit elements of the integrated circuit devices from excessive voltage levels. While the protection arrangements disclosed herein may be useful in any integrated circuit device, it is particularly useful in devices manufactured using manufacturing techniques for very large scale integration (VLSI) and ultra-large scale integration (ULSI) integrated circuit chips, and especially in those chips which have input circuit elements that are unable to withstand high input voltages which may result from electrostatic discharges which may occur at the terminal pins of the integrated circuit package while it is being handled.

2. Description of the Prior Art

Over the past twenty-plus years the design of integrated circuit devices has proceeded from small, medium and large scale integration to the current very large scale integration in an effort to incorporate more circuit elements such as transistors, capacitors and, to a lesser extent, resistors, onto a single chip, with the primary objects being to produce a smaller device that performs more functions and performs them faster. As a result, the circuit elements, especially the transistors, have not only become smaller in the amount of chip surface area which they take up, but they have also become thinner.

More specifically, in order to provide transistors with the desired increased switching speed, two things are done in the design of the transistors. First, since the transistors are generally MOSFETs (metal-oxide-semiconductor field effect transistors) or more generally IGFETs (insulated gate field effect transistors, where the gate electrode may be metal or any other suitable material). The source and drain regions are placed closer together to reduce the length of the channel and thus reduce the transit time of the charge carrier therethrough.

Second, the thickness of the insulating layer (for example, a silicon dioxide, or "oxide", layer) between the transistor's gate electrode, on the one hand, and the source and drain electrodes and the channel therebetween, on the other hand, is substantially reduced, which in turn reduces the input capacitance of the transistor, allowing it to react faster to a signal from upstream circuitry. However, the reduction in the thickness of this "gate oxide" layer has resulted in a corresponding reduction in its ability to withstand abnormally high voltages without rupturing. Such high voltages can be particularly stressful on the gate oxide of input elements such as, for example, the first transistor in a circuit which receives a signal voltage from an input terminal. Such transistors can receive very high voltages from electrostatic discharge into the pins of the integrated circuit package during handling, which voltages can range up to the 5,000 volt level. In current VLSI devices, the thickness of the gate oxide layer has been reduced to the order of one to five hundred Angstroms, and so the breakdown voltage of the gate oxide in such transistors has been correspondingly reduced to the order of 10 to 50 volts. It is clear that 5000 volt electrostatic discharge voltages applied to input transistors having such a thin gate oxide would destroy them.

A number of input protection arrangements have been devised to protect the input transistors from excessively high input voltages. For example, resistors have been connected in series between the input terminal, or bonding pad (that is, the, generally metal, terminal on the chip surface to which is bonded the wire connecting to the circuit package pins) and the input transistor so as to attenuate the voltage as applied to the gate terminal of the input transistor. While this arrangement does reduce the voltage at the gate terminal of the input transistor, the addition of the resistor will also increase the capacitance of the path between the bonding pad and the processing circuitry on the chip, which will also reduce the circuit response of the chip. Furthermore, since a resistor impedes the flow of current away from the bonding pad, the bonding pad itself, as well as the oxide layer which insulates the pad from the substrate, may also be stressed. While the oxide layer under the bonding pad, which is a field oxide layer, is much thicker than the gate oxide layer (typically on the order of ten times the thickness of the gate oxide), an electrostatic discharge voltage can still cause ruptures in this field oxide if the current from the discharge is unable to dissipate sufficiently rapidly, which in turn can cause the metal from the pad to spike through to the substrate, thereby causing the chip to fail.

To supplement the resistors in input protection arrangements, diodes are often connected between the power buses, such as the $V_{SS}$ and $V_{DD}$ power lines on the chip, and the line connecting the bonding pad to the input transistor. These diodes discharge the excessive input voltage to the appropriate power line thereby serving as a clamp to limit the voltage level applied to the input circuit elements on the chip. The diodes can, however, also add capacitance to the input of the integrated circuit with the same problems noted above. Furthermore, the diodes are also subject to spiking through the doped region to the substrate, which can result in failure.

Other arrangements have used MOSFET or other insulated gate field effect (IGFET) input protection transistors in which the gate is formed over the thicker field oxide, not the thinner gate oxide, to ensure that they have a higher threshold, or turn-on, voltage. Typically the gate can be connected either to the input line or to a power bus. Currently-used input protection IGFETs, however, present significant problems. While such transistors have a relatively thick field oxide insulation over the channel region between the source and drain regions, the oxide is formed so as to taper to a somewhat thinner layer over the source and drain regions. Accordingly, while the thick oxide over the channel region may prevent the transistor from turning on until somewhat elevated signal voltage levels are reached, the thinner oxide between the source and drain regions, on the one hand, and the gate, on the other, may be ruptured as a result of voltage increases from electrostatic discharge, before a high voltage change can be discharged, thereby destroying the transistor. Furthermore, like diodes, the transistors are also subject to spiking through the doped source and drain regions, which can result in failure of the input protection circuit.

SUMMARY OF THE INVENTION

The invention provides a new input protection arrangement for an integrated circuit device. A metal bonding pad, deposited on an insulating surface layer of silicon dioxide in the field oxide region, is connected to a conducting path, such as metal or polysilicon, which leads to an input transistor of the integrated circuit chip. The conducting path is itself deposited on a field oxide insulating layer. Disposed in the substrate on opposing sides of at least a portion of the conducting path, and beneath the insulating layer, are doped regions of an opposite conductivity type from the substrate, which form the source and drain regions of an insulated gate field effect transistor (IGFET). The portion of the conducting path bordered by the source and drain regions forms the gate terminal of the IGFET. The bonding pad is, in turn, also connected to one of the source or drain regions, and the other region is connected to the appropriate $V_{SS}$ or $V_{DD}$ voltage bus, which comprises a sink or source for current from or to the transistor. When a voltage is applied to the path above the threshold voltage, which is proportional to the thickness of the field oxide layer between the path and the portion of the substrate between the source and drain regions, a channel will be established between the source and drain to allow current to flow therethrough from the bonding pad to the reference voltage line. The field oxide layer under the portion of the conducting path forming the gate electrode, that is, the portion of the path over the source and drain regions and the portion of the chip substrate therebetween which defines the channel, has a substantially uniform thickness to prevent rupture of the oxide in the event of electrostatic discharge induced voltages.

The source and drain regions of the new input protection transistor are formed with a small region of conventional doping levels which are isolated from the chip substrate by larger wells of the same conductivity type as the smaller regions, but of a lower doping level. The smaller, more heavily doped regions are of the same doping levels, and the same depth, as the other doped regions forming the other circuitry on the chip. The larger, less heavily doped wells prevent spiking of the conductors connected to the source and drain through to the substrate.

In a further aspect of the invention, the bonding pad is also deposited over a well, or less heavily doped region of the device having a conductivity type which is the same as that of the source and drain regions. The well protects the substrate from discharges from the pad which can occur if the pad or the field oxide layer beneath it is damaged during testing or bonding or by voltages induced by electrostatic discharges. Furthermore, the addition of the well beneath the input pad adds a second capacitance, namely, the capacitance between the well and substrate, to the capacitance between the pad and well, which capacitances are in series. This results in a reduction of the input capacitance at the input pad if the well is not present, as these would then be a single capacitance between the pad and substrate, which would be smaller than the smaller one of the two capacitances in the new arrangement. The reduced input capacitance aids in enhancing the speed of circuit response of the integrated circuit chip to the input signals. Furthermore, since the two capacitors will divide the voltage between the bonding pad and the substrate, in inverse relation to their capacitances, the voltage across the oxide layer will be reduced, thereby reducing the possibility of its rupturing. The well under the input pad is formed at the same time that the well in the source and drain regions are formed, using the same masks and having the same depth, and thus adds no manufacturing steps or expense.

Brief Description of the Drawings

This invention is pointed out with particularity in the appended claims. The above and further advantages of this invention may be better understood by referring to the following detailed description taken in conjunction with the accompanying drawings, in which:

Description of the Preferred Embodiments

Figure 1:
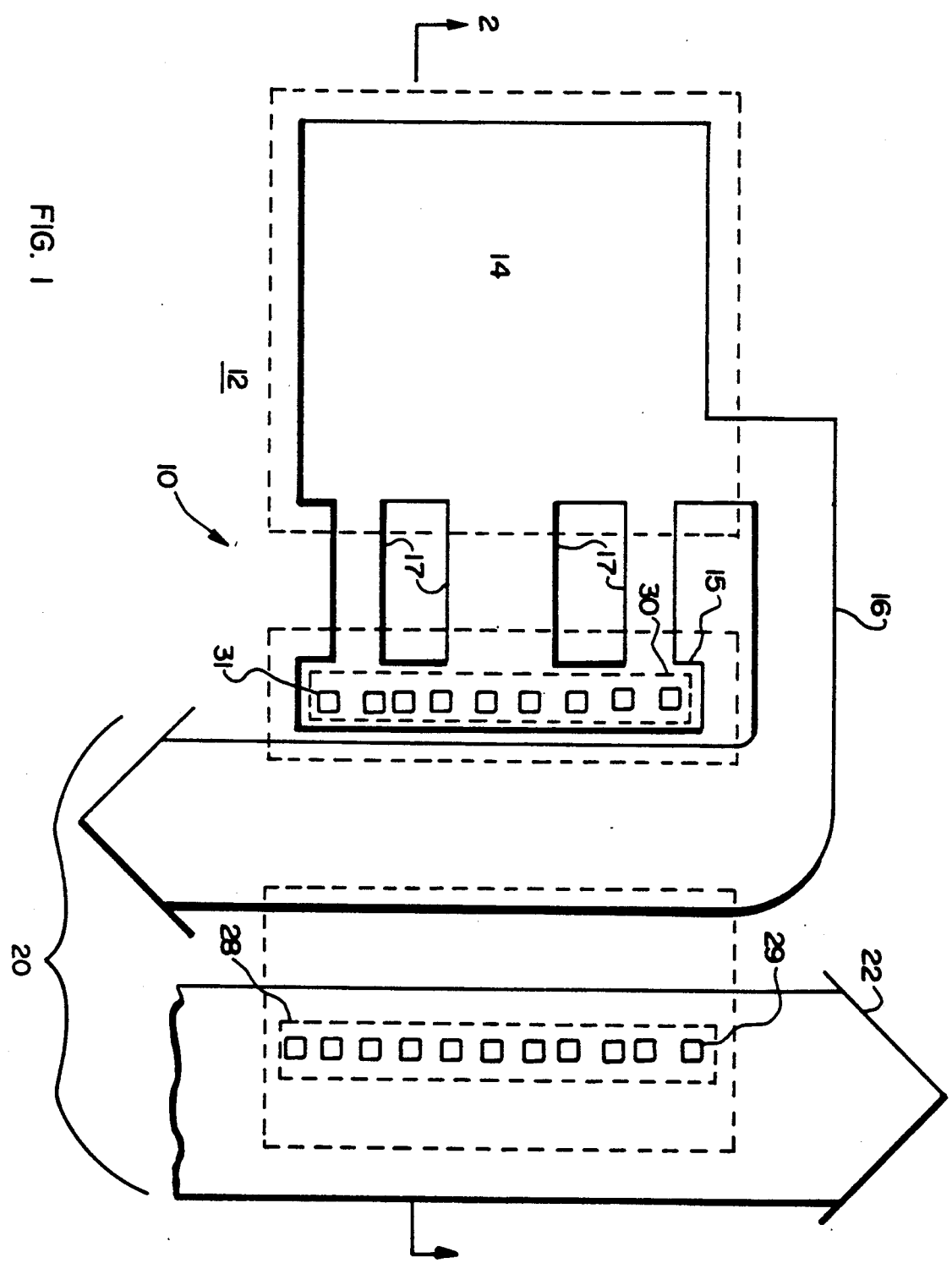
FIG. 1 is a top plan view of an input protection arrangement according to the invention.
Figure 2:
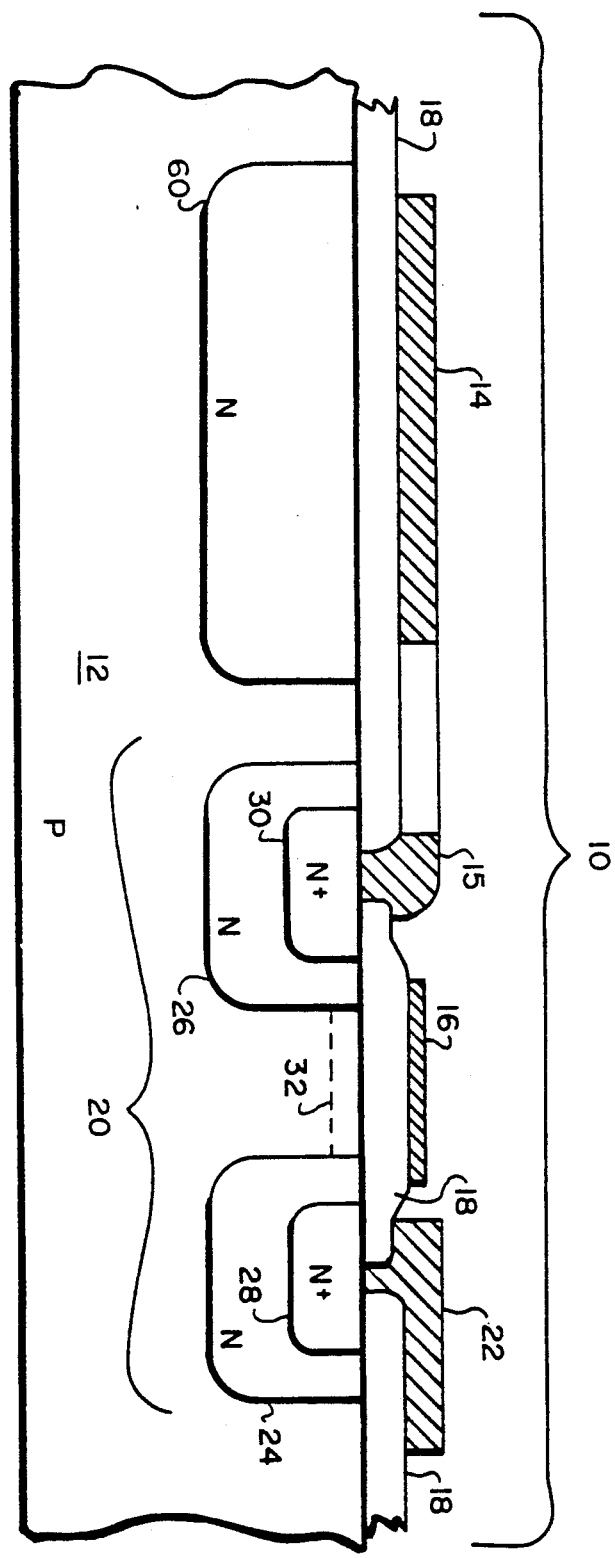
FIG. 2 is a cross-sectional view of the arrangement depicted in FIG. 1 as taken along the line 2—2 in FIG. 1.

With reference to FIGS. 1 and 2, the invention provides an input protection arrangement 10 for an integrated circuit chip formed in a substrate 12. In one specific embodiment, the substrate is formed with P-type doping; however, it will be apparent to those skilled in the art that the invention can be practiced in integrated circuits having a substrate formed with N-type doping. The arrangement includes a metal bonding pad 14 to which a wire lead can be bonded to connect the circuit to a pin in the chip package or carrier. In addition, the pad permits testing of the circuit by probes in a known manner. The pad 14 is electrically connected to a conducting path 16 which couples signals received at the pad 14 to the processing circuitry on the chip (not shown). The conducting path 16 may be formed from metal or polysilicon and is deposited on an insulating field oxide layer 18 (see FIG. 2) which may comprise, for example, a layer of silicon dioxide (that is, "oxide") formed in a known manner. The pad 14 is also formed on the field oxide layer 18.

Field oxide is distinguished from gate oxide, as noted in S.M. Sze, *Physics of Semiconductor Devices* (2d Ed) p. 433 (John Wiley & Sons, 1981). Field oxide is much thicker than gate oxide and isolates the various components in the processing circuitry from each other. The thinner gate oxide insulates the gate terminal from the substrate and the source and drain regions in the processing circuitry. The field and gate oxides are formed at distinct steps in the fabrication process, using different masks. Both the conductivity path 16 and pad 14 are formed on the field oxide layer.

In one aspect of the invention, the input protection arrangement includes a transistor 20 which discharges current from high-voltage electrostatic discharges applied to pad 14 to a path 22 which buses a reference voltage throughout the integrated circuit. Path 22 may, for instance, comprise a power bus which provides power to operate the processing circuitry on the chip. The power lead generally is made of a metal path deposited over the oxide layer 18. The transistor 20 includes a source region 24 and a drain region 26, both of which have N-type doping, which extend partially under opposing sides of the conducting path 16 near its connection to pad 14. The reference path 22 is connected to source region 24 through a region 28 of enhanced (N+) doping in a known manner which provides an ohmic, non-rectifying, contact between the reference path 22 and the source region. Similarly, the drain region 26 connects to a metal tab 15, which in turn connects to and extends from pad 14, through a region 30 of enhanced N-type doping. The enhanced doping region 30 also provides an ohmic contact with the tab 15. Contacts 29 and 31 defined in the oxide 18 allow contact between path 22 and region 28, and between tab 15 and region 30, respectively.

The regions 28 and 30 of enhanced doping are of the same depth as the source and drain regions of the processing circuitry on the chip, and of the same doping level, namely, on the order of $10^{20}$ charge carriers per cubic centimeter. These regions may also be formed at the same time in the fabrication process as the source and drain regions of the processing circuitry.

The regions 24 and 26, which form wells around the regions 28 and 30, are significantly larger than regions 28 and 30, and of a much lower doping level. Regions 24 and 26, in one specific embodiment, have depths on the order of ten times the depths of regions 28 and 30, and doping levels of $10^{15}$ charge carriers per cubic centimeter, or higher. Preferably, the doping levels of the regions 24 and 26 are on the order of approximately ten times the level of the substrate, which is $10^{14}$ charge carriers per cubic centimeter, but they may be as high as the doping levels of regions 28 and 30. However, it is preferable to maintain a difference between the doping levels of regions 24 and 26 and those of regions 28 and 30.

In operation, if a signal having an excessive voltage, from an electrostatic discharge, for example, is applied at pad 14, the voltage at the pad will also be applied to conducting path 16. In the portion of path 16 corresponding to transistor 20, a channel 32 will be established in substrate 12 between source region 24 and drain region 26. The channel 32 allows current to flow from pad 14, through tab 15 and between the source and drain regions thereby allow the current to be drained from the pad to be dissipated in the reference path 22.

Since the turn-on threshold voltage of an insulated gate field effect transistor, such as transistor 20, is inversely related to the capacitance between the gate formed by path 16 and the surface of the substrate, which is, in turn, inversely related to the thickness of the oxide 18 between the gate terminal and the substrate to reduce the threshold voltage of transistor 20 to protect the processing circuitry from electrostatic discharge, the thickness of the oxide insulating the gate from the top surface of the substrate in the area of channel 32 must also be reduced. However, the oxide 18 cannot be so thin as to reduce the threshold voltage of transistor 20 to a point where the transistor turns on at normal signal levels. If that were to occur, the transistor would shunt the desired input signals away from the processing circuitry. Since the field oxide is typically ten times the thickness of the gate oxide, the transistor 20 will not turn on until the voltage level at path 16 is ten times the level which would normally turn on the chip's processing circuitry.

Figure 3:
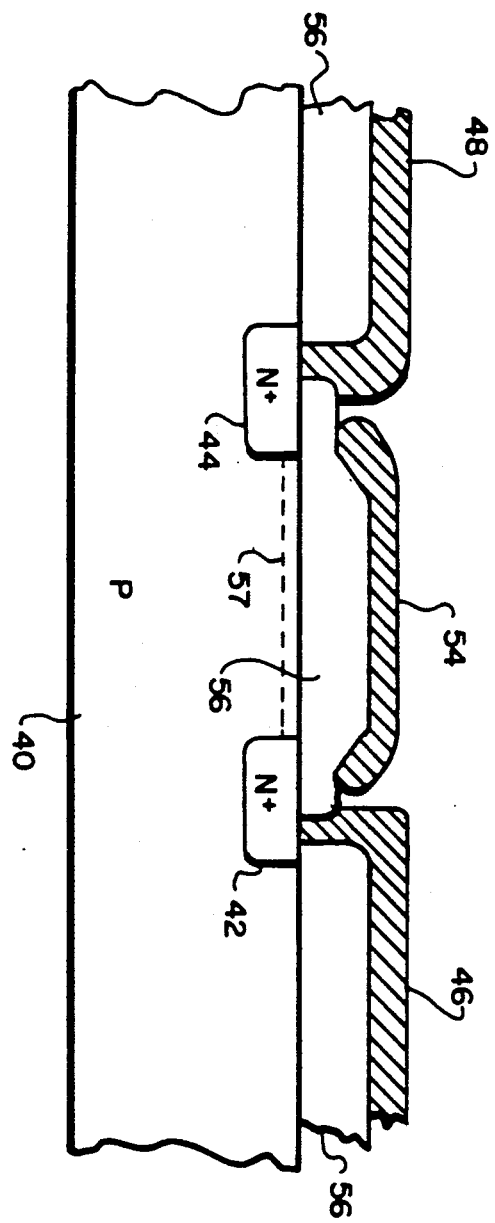
FIG. 3 is a cross-sectional view of a prior art insulated gate field effect transistor.

As has been noted above, prior input protection arrangements have included transistors, which have also been formed in the gate oxide regions of the chip. FIG. 3 depicts a cross-section of such a prior art transistor. The transistor includes a source region 42 and a drain region 44, respectively connected to terminals 46 and 48. The gate of the transistor 54 is deposited on a field oxide layer 56 which, as can be seen in FIG. 3, is contoured so as to be thicker in the channel region 56 between source region 42 and drain region 44, and thinner in the area directly overlying the source and drain regions. The thickness of the oxide insulating the gate 54 from the source and drain regions 42 and 44 is as thin as the gate oxide in the processing circuitry on the chip. Since the thickness of the oxide insulating the source and drain regions from the gate is much thinner than over the channel, the voltage at which the oxide between the gate terminal and the source and drain regions will rupture is also much reduced. Thus, in the event of a substantial voltages such as would be caused by an electrostatic discharge, the field oxide layer between the gate and drain or source may rupture and allow the gate to short through to either or both of the source and drain regions.

With reference again to FIG. 2, the invention alleviates the oxide rupture problem by providing that the field oxide layer 18 has a substantially uniform thickness underlying the gate portion of path 16 and between source and drain, 24 and 26. Since the field oxide layer has a uniform thickness, a channel 32 will form between the source and drain at a lower voltage than the oxide rupture voltage and therefore the problem of the oxide ruptureing will be eliminated.

Furthermore, in the transistor depicted in FIG. 3, the source and drain regions 42 and 44 have the same junction depths and doping levels as regions 28 and 30 of transistor 20. Thus, the transistor depicted in FIG. 3 is much more susceptible to spiking to the substrate 40 during application of high voltages than is transistor 20.

It will also be appreciated that, since regions 24 and 26 are much larger in width and depth than regions 42 and 44, the junctions between the regions 24 and 26 and the substrate 12 will also have much larger areas than do the junctions between regions 42 and 44 and substrate 40. In some cases, depending on the polarity of the voltage of the electrostatic discharge, region 26, for example, in combination with substrate 12 will act as a diode allowing current to flow from the substrate into the region 26. This will occur if the voltage of the discharge is negative with respect to the substrate. Since the area of the junction of region 26 is much larger than the area of the corresponding junction of the transistor in FIG. 3, the transistor 20 will more easily accommodate the relatively large currents that can flow during electrostatic discharge. Furthermore, since the junction between the region 26 and substrate 12 is relatively deep and smooth, with no sharp corners, large voltages across the junction will result in charge carriers being fairly uniform across the junction, whereas in shallow junction transistors such as depicted in FIG. 3, the shallow junction will have sharp edges which can result in the development of large electric fields in certain portions of the junction at high voltages, which can result in junction breakdown.

In another aspect of the input protection arrangement 10, the circuit includes a doped well identified as region 60 underlying pad 14. Region 60 is provided as a barrier to prevent pad 14 from spiking through to substrate 12 in the event of electrical stresses caused by electrostatic discharges, or after mechanical stresses which can occur during bonding to a lead wire or during testing by a probe in a known manner. In addition, it will be appreciated that providing region 60 will reduce the capacitance which would otherwise be exhibited between the input pad 14 and the substrate 12. Specifically, in the arrangement 10, an input capacitance is exhibited between the input pad and the upper surface of region 60, and a second capacitance is exhibited at the P-N junction between region 60 and substrate 12. Since these two capacitances are formed in series between the input pad and the substrate 12, the effective input capacitance between the input pad and the substrate will be less than if the circuit is formed without region 60. In that case, the input capacitance formed from pad 16 overlying the substrate 12, which is a single capacitance, would have a value on the order of either of the capacitances formed in the new arrangement 10. Thus, it can be seen that providing region 60 underlying pad 14 can reduce the input capacitance at the input pad. It will also be appreciated that, since the capacitances will divide the voltage between the bonding pad and the substrate, the voltage across the oxide will be lower, thereby reducing the likelihood of its rupturing during electrostatic discharge.

It will also be appreciated that the well 60 and region 26 also form drain and source regions, respectively of another IGFET having paths 17 forming the gate to discharge positive current if a high positive voltage is applied to the bonding pad 14. Furthermore, if a high negative voltage is applied to the bonding pad, since the voltage will be coupled to the well 60, current will flow from the P substrate 12 to the well to relieve the applied voltage.

Region 60 can be formed at the same time as the regions 24 and 26 of transistor 20. The same mask can be used, and the same doping concentrations and doping depths will provide a satisfactory well for region 60. In the current two-micron VLSI technology, which allows channel lengths as short as two-microns, the depths of regions 24, 26 and 60 in one specific embodiment is on the order of ten times the depths of regions 28, 30, 42 and 44, or about three and a half microns, which typically provides sufficient depth to prevent spiking from pad 14 to substrate 12 at elevated voltage. In addition, since oxide 18 is field oxide, which is produced during a step in the production process of the chip, no extra step is required to produce it for transistor 20.

The foregoing description has been limited to a specific embodiment of this invention. It will be apparent, however, that the invention can be practiced in integrated circuit chips having diverse basic construction than is disclosed in this specification with the attainment of some or all of the advantages of the invention. Therefore, it is the object of the appended claims to cover all such variations and modifications as come within the true spirit and scope of the invention.

What is claimed as new and desired to be secured by Letters Patent of the United States is:

1. An input protection arrangement for an integrated circuit device on a semiconductor substrate of a first conductivity type having a bonding pad for forming an external electrical connection, said bonding pad being supported by an insulating layer and said insulating layer being supported by a doped region comprising a relatively deep well of a second conductivity type, said bonding pad being connected to a conducting path on said substrate for electrically connecting said pad to internal circuitry on said integrated circuit device, said integrated circuit device further including a reference voltage path, said input protection arrangement comprising two regions of the second conductivity type on opposing sides of at least a portion of said conducting path, said two regions and the area therebetween being covered with a layer of insulating material having a substantially uniform thickness corresponding to the thickness of field oxide, apertures in said layer of insulating material for connecting one of said two regions to said pad and means for connecting the other region to said reference voltage path, whereby said two regions define source and drain regions and the conducting path defines the gate terminal of an insulated gate field effect transistor which conducts input current associated with voltages in excess of a selected level between said pad and said reference voltage path.

2. An input protection arrangement as defined in claim 1 wherein each of said two regions comprises a shallow portion of enhanced second conductivity type separated from said substrate by a relatively deep well portion of said second conductivity type.

3. An input protection arrangement as defined in claim 1 wherein said conducting path is polysilicon.

4. An input protection arrangement as defined in claim 1 wherein said conducting path is metal.

5. An input protection arrangement as defined in claim 1 wherein said bonding pad comprises a metal layer situated adjacent to the region connected thereto, said metal layer extending to said adjacent region and connecting thereto to provide an electrical path between said adjacent region and said conducting path to thereby interconnect said adjacent region and said gate terminal of said insulated gate field effect transistor.

6. An input protection arrangement as defined in claim 2 wherein said conducting path covers at least a portion of the deep well portions without covering the shallow portions.

* * * * *